United States Patent
Dulmet et al.

(10) Patent No.: US 9,246,472 B2
(45) Date of Patent: Jan. 26, 2016

(54) VOLUME WAVE RESONATOR USING EXCITATION/DETECTION OF VIBRATIONS

(75) Inventors: Bernard Dulmet, Besancon (FR); Mihaela Ivan, Besancon (FR); Sylvain Ballandras, Besancon (FR)

(73) Assignees: CENTRE NATIONAL DE LA RECHERCHE SCIENTIFIQUE, Paris (FR); UNIVERSITE DE FRANCHE-COMTE, Besancon (FR)

( * ) Notice: Subject to any disclaimer, the term of this patent is extended or adjusted under 35 U.S.C. 154(b) by 102 days.

(21) Appl. No.: 14/131,341

(22) PCT Filed: Jul. 6, 2012

(86) PCT No.: PCT/EP2012/063300
§ 371 (c)(1),
(2), (4) Date: Apr. 10, 2014

(87) PCT Pub. No.: WO2013/007652
PCT Pub. Date: Jan. 17, 2013

(65) Prior Publication Data
US 2014/0300246 A1    Oct. 9, 2014

(30) Foreign Application Priority Data
Jul. 8, 2011 (FR) .................... 11 56250

(51) Int. Cl.
*H03H 9/24* (2006.01)
*B06B 1/02* (2006.01)
(Continued)

(52) U.S. Cl.
CPC ............ *H03H 9/2405* (2013.01); *B06B 1/0292* (2013.01); *H03H 9/02259* (2013.01); *H03H 9/02409* (2013.01); *H03H 9/174* (2013.01); *H03H 9/2463* (2013.01)

(58) Field of Classification Search
CPC ..... H03H 9/24; H03H 9/2405; H03H 9/02409
USPC ........................................................ 333/186
See application file for complete search history.

(56) References Cited

U.S. PATENT DOCUMENTS

| 8,111,114 B2 * | 2/2012 | Bhave et al. ............. 333/186 |
| 2009/0001853 A1 | 1/2009 | Adachi et al. |
| 2009/0108381 A1 | 4/2009 | Buchwalter et al. |

FOREIGN PATENT DOCUMENTS

EP    1610459 A1    12/2005

OTHER PUBLICATIONS

Hariklia Deligianni et al., MEMS Fabrications for Wireless Communications Using Copper Interconnect Technology, IBM Research Report, Feb. 28, 2005, RC23547 (WO502-155), IBM Research Division, Yorktown Heights, New York.

(Continued)

*Primary Examiner* — Stephen E Jones
*Assistant Examiner* — Scott S Outten
(74) *Attorney, Agent, or Firm* — Eric L. Lane; Green Patent Law

(57) ABSTRACT

The invention relates to an acoustic volume wave resonator including a mounting, a resonating substrate, and a diaphragm. The mounting comprises an internal cavity and an internal electrode, so as to form a gap area between the internal electrode and a portion of the diaphragm. The resonating substrate is configured to generate longitudinal mode acoustic waves vibrating at the work frequency of the resonator, when an electrostatic field having a sinusoidal component at a work frequency is generated in the gap area by applying a differential voltage between the diaphragm or the first surface of the resonating substrate on the one hand and the internal electrode on the other hand.

14 Claims, 5 Drawing Sheets

Figure 1:
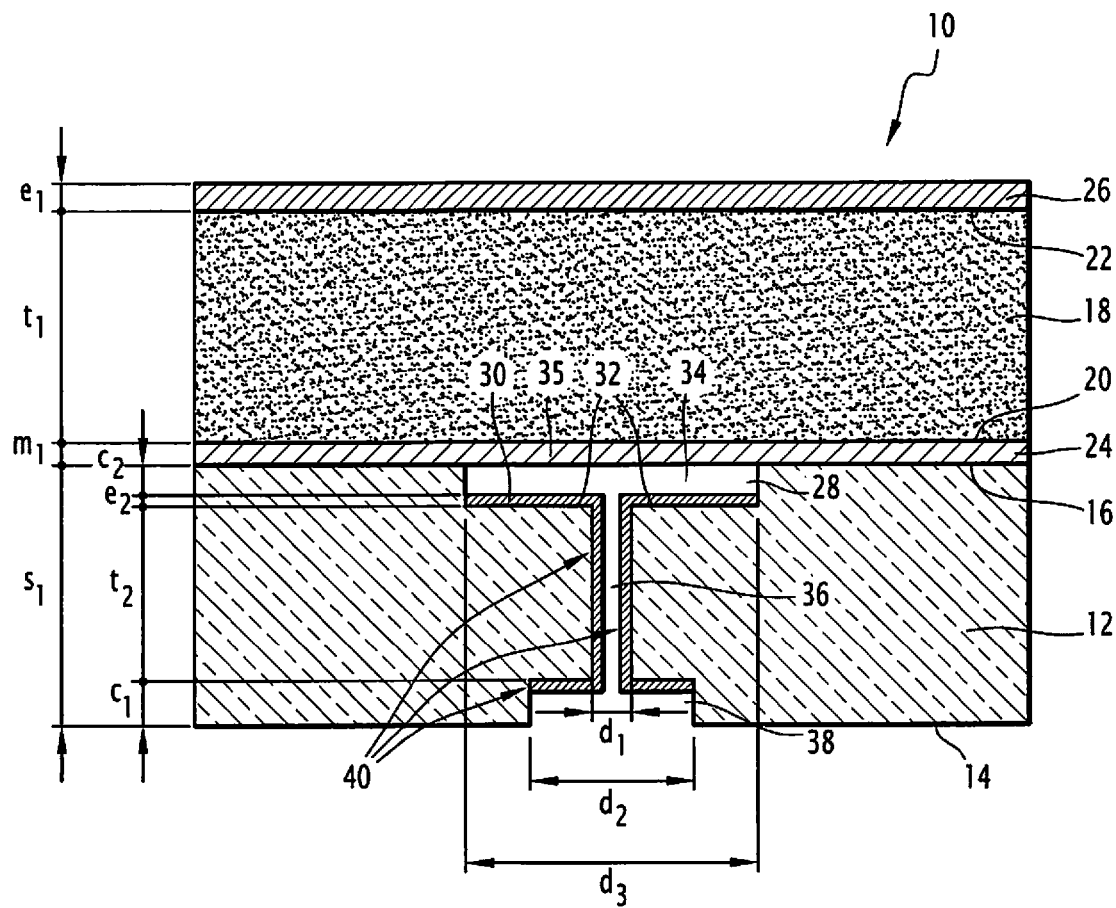

(51) Int. Cl.
*H03H 9/02* (2006.01)
*H03H 9/17* (2006.01)

(56) References Cited

OTHER PUBLICATIONS

Marie-Ange Eyoum et al., Analysis and Modeling of Curvature in Copper-Based MEMS Structures Fabricated Using CMOS Interconnect Technology, 13th International Conference on Solid-State Sensors, Actuators and Microsystems, Digest of Technical Papers, Seoul, Korea, Jun. 5-9, 2005.

C.V. Jahnes et al., Simultaneous Fabrication of RF MEMS Switches and Resonators Using Copper-Based CMOS Interconnect Manufacturing Methods, Micro Electro Mechanical Systems, 2004.

International Search Report in related PCT Application No. PCT/EP2012/063300.

* cited by examiner

VOLUME WAVE RESONATOR USING EXCITATION/DETECTION OF VIBRATIONS

The present invention relates to an acoustic volume wave resonator configured to resonate at a predetermined work frequency comprising:
- a mounting, comprising a first surface and a second surface, formed by a layer with a first thickness $s_1$ of a first acoustically and electrically insulating material,
- a resonating substrate, comprising a first surface and a second surface, made up of at least one layer with a second thickness $t_1$ of a second acoustically resonating material, and
- a diaphragm made up of a layer with a third thickness of a third material, the diaphragm rigidly connecting the second surface of the mounting on the one hand and the first surface of the resonating substrate on the other hand.

Resonating micro-electromechanical systems (MEMS) are known.

Thus known is the family of resonators whereof the resonating element is deformed in a transverse direction with respect to the direction of propagation of the waves.

For example, document US 2009/108381 A1 discloses a resonator whereof the resonating element is a beam situated in a cavity and whereof both ends are fastened to mounting studs. The lower surface of the beam bears a first electrode. Across from the latter, a second electrode is provided on the lower wall of the cavity, between the mounting studs of the beam. The variation of the difference in potential between the first and second electrodes generates an electrostatic force capable of oscillating the beam.

Also known is the family of resonators whereof the resonating element is deformed in a direction parallel to the direction of propagation of the waves.

For example, the article by V. Kaajakari et al. "Square-Extensional Mode Single-Crystal Silicon Micromechanical RE-resonator" in "the 12th International Conference on Solid State Sensors, Actuators and Microsystems (Boston-2003)" published by IEEE describes the use of a square wafer as the resonating element, the wafer being deformed in terms of length and width.

Such resonators, called "acoustic volume wave" resonators, have the advantage of operating with high use frequencies. They always include a transducer made up of a piezoelectric material.

In particular, in the family of acoustic volume wave resonators, FBAR (Film Bulk Acoustic Resonator) resonators have the advantage of obtaining resonators with a high quality factor and having good co-integration with a monolithic circuit. These piezoelectric excitation resonators are commonly used to design electrical oscillators, filters or sensors.

In an effort to access more varied structures in terms of materials and even eliminating the use of a piezoelectric material, an electrostatic excitation mode has been studied generically and is described by A. Reinhardt in his doctoral thesis at the Université de Franche Comté 2005, entitled "Simulation, conception et réalisation de filtres à ondes de volume dans des couches minces piézoélectriques".

This document describes an electrostatic excitation resonator comprising a thin film, which is not necessarily piezoelectric, metallized on both faces by two electrodes, across from which two counter-electrodes have been placed on either side secured to a same housing, such that two gaps are formed between the electrode/counter-electrode pairs.

An electrical field is generated by applying a harmonic potential difference between the electrodes and the counter-electrodes.

The electrostatic force generated in the two mountings attracts the electrodes toward the counter-electrodes, causing stretching of the film in terms of its thickness. Since the electrostatic forces are always attractive, direct excitation of oscillating mechanical fields is not possible. It is first necessary to polarize the resonator by applying a direct voltage, then applying an alternating voltage to it at the same time that increases or releases the attractive force undergone by the film.

In this configuration, there is an exchange between the electrostatic mode existing in the gap and the mechanical mode excited in the diaphragm.

For this resonator, the coupling coefficient depends on the elasticity of the material, the considered geometry and the applied polarization.

However, it is necessary to consider that the mechanical strength of the material of the film imposes a limit on the deformations that may be undergone by the film and a symmetry fault of the electrostatic force risks destroying the film. Furthermore, the breakdown of the air mounting is a common cause of destruction of the film. Thus, the value of the polarization potential is limited to avoid any destruction.

The coupling increases with the polarization of the resonator and decreases with the width of the gap.

It is difficult to maximize the coupling coefficient. For example, for a 1 µm silicon diaphragm, polarized with a voltage of 40 V, an air mounting of only 10 nm is necessary to obtain a coupling coefficient comparable to those obtained by piezoelectric excitation. And the order 3 dependency of that parameter means that by choosing a gap dimension that is only slightly larger, the coupling coefficient already drops considerably if the polarization voltage is not increased in parallel, which, however, accelerates the risks of rupture of the diaphragm.

Thus, this principle of electrostatic excitation has been deemed applicable, since the calculations show an electrostatic coupling coefficient of practically zero.

The aim of the invention is therefore to improve the electrochemical coupling associated with an acoustic volume wave excitation mode in all types of materials, for a resonator application.

To that end, the invention relates to an acoustic volume wave resonator, a method for manufacturing such a resonator, and an electronic component comprising such a resonator according to the claims.

Figure 2:
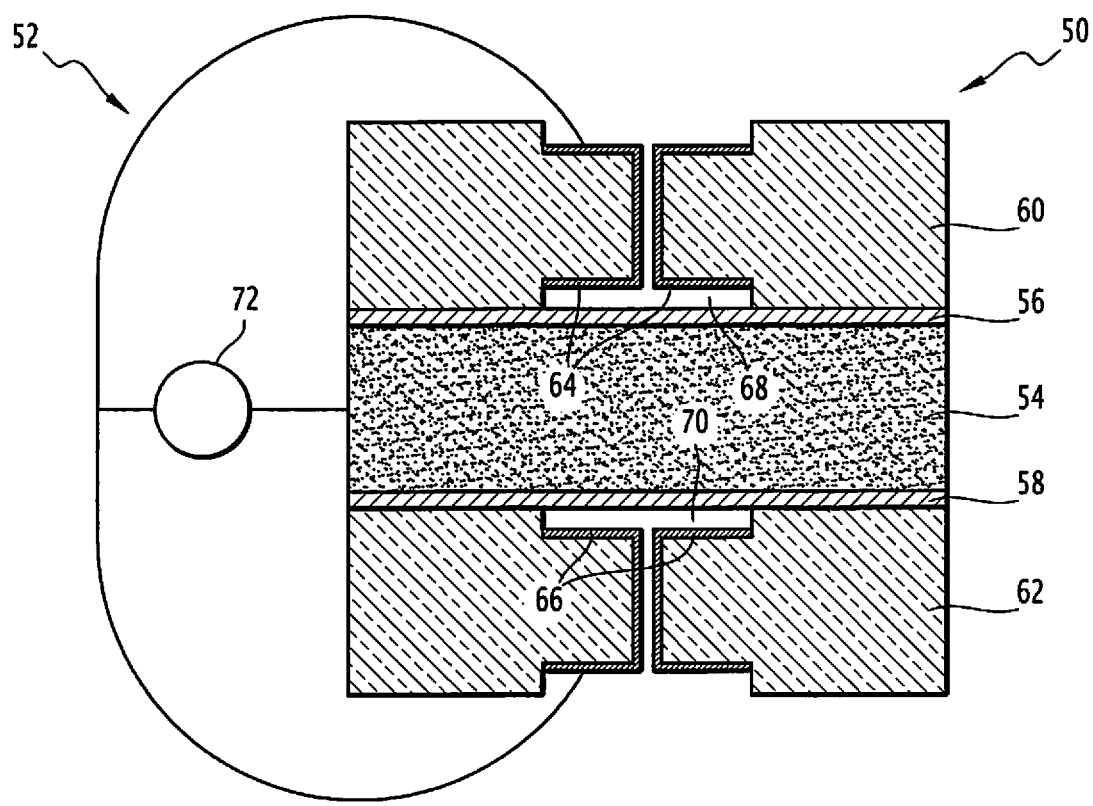
Figure 3:
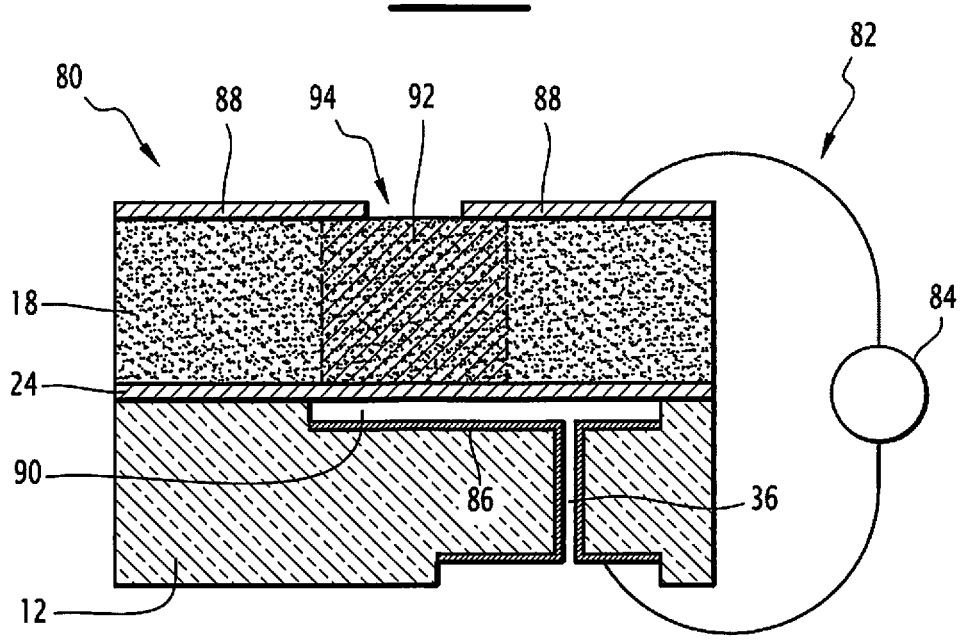
Figure 4:
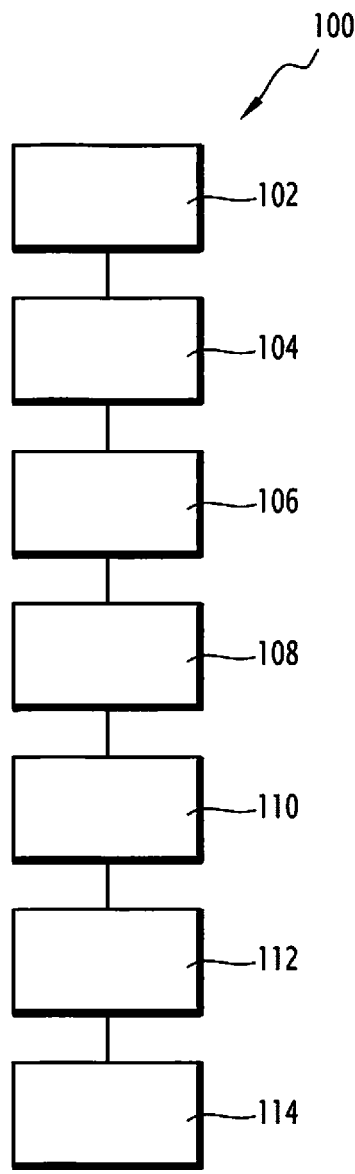
Figure 5:
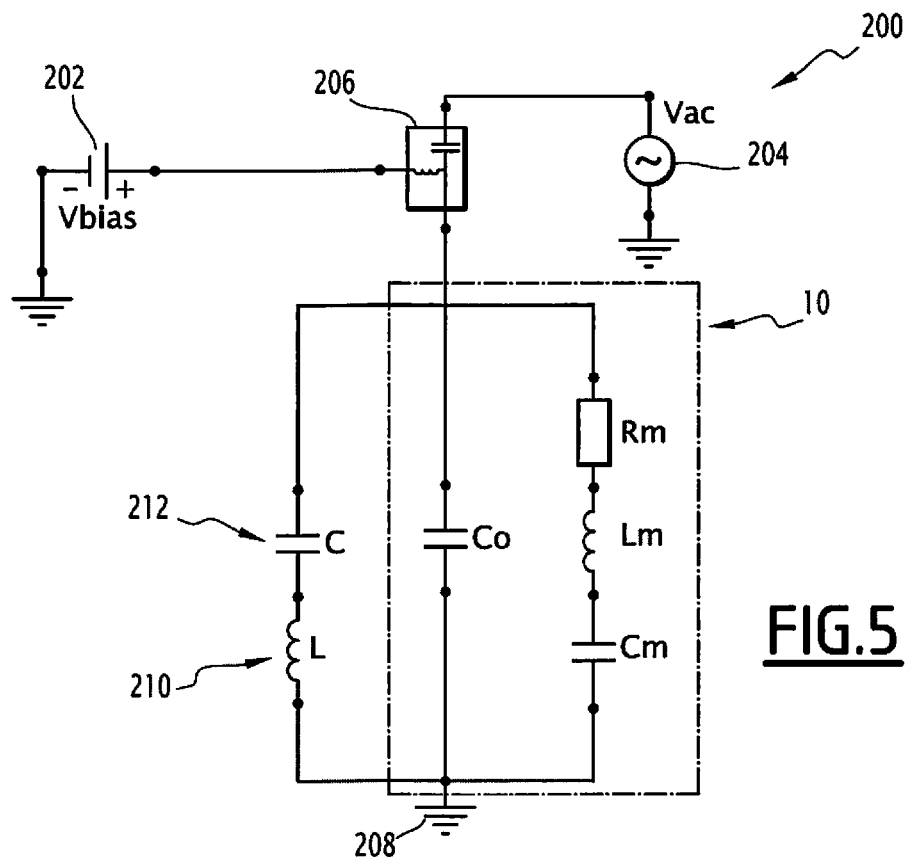
Figure 6:
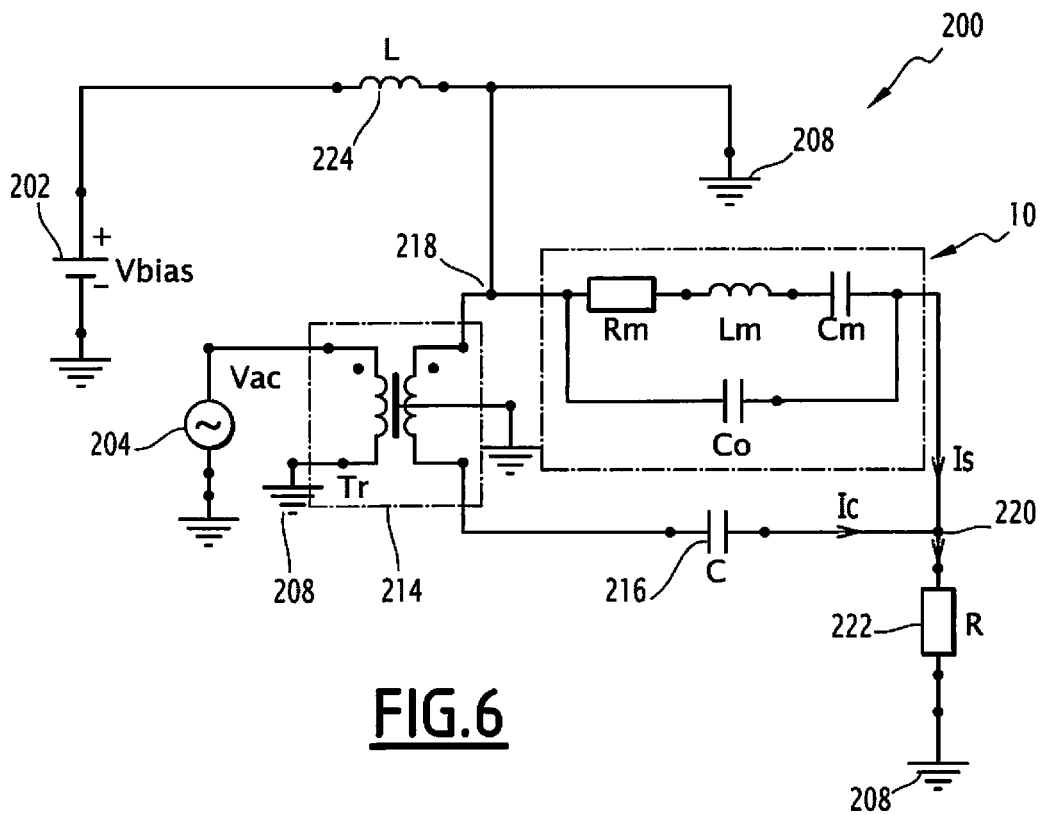
Figure 7:
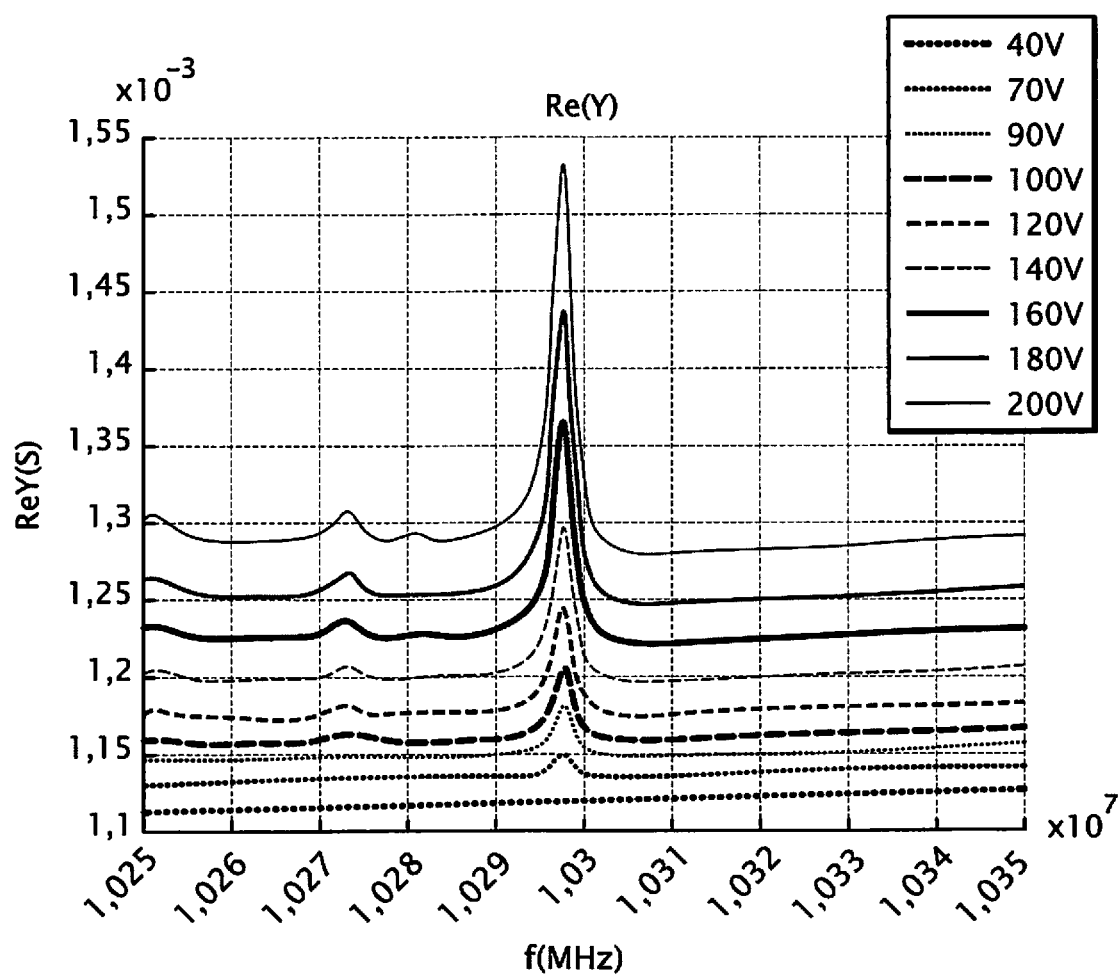

The features and advantages of the invention will appear upon reading the following description, provided solely as a non-limiting example, and done in reference to the appended drawings, in which:

FIG. 1 is a diagrammatic illustration of an acoustic volume wave resonator according to the invention, FIG. 2 is a diagrammatic illustration of a resonator comprising an excitation/detection device according to a first embodiment, FIG. 3 is a diagrammatic illustration of a resonator comprising an excitation/detection device according to a second embodiment, FIG. 4 is a flowchart of a method for producing a resonator according to the invention, FIG. 5 is a diagram of a device for compensating the static capacity of the resonator by induction coil, FIG. 6 is a diagram of a device for compensating the static capacity of the resonator by transformer, and FIG. 7 is a diagram showing the electrical response as a function of the polarization voltage of a resonator according to the invention.

FIG. 1 shows one embodiment of a volume wave resonator 10 according to the invention.

The resonator 10 comprises a stack of successive layers including:
- a mounting 12, comprising a first surface 14 and a second surface 16, made up of a layer with a first thickness $s_1$ of a first acoustically and electrically insulating material, for example glass,
- a resonating substrate 18, comprising a first surface 20 and a second surface 22, made up of a layer with a second thickness $t_1$ of a second acoustically resonating material, for example conducting doped silicon,
- a diaphragm 24 made up of a layer with a third thickness $m_1$ of a third material, for example an electrically insulating material such as silica, said diaphragm 24 rigidly connecting, at least in an acoustically inert region, the second surface 16 of the mounting 12 on the one hand and the first surface 20 of the resonating substrate 18 on the other hand, and
- a metal external electrode 26, positioned on the second surface 22 of the resonating substrate 18 and made up of a first layer of metal with a thickness $e_1$, for example aluminum.

The mounting 12 further includes an internal cavity 28, emerging on the second surface 16 of the mounting 12 and having a floor surface 30 situated withdrawn in the direction of the thickness of the mounting 12 relative to the second surface 16 of the mounting 12.

The mounting 12 also includes an internal electrode 32, which is planar and metallic, formed by a second layer of metal, for example gold, and deposited on the floor surface 30.

Thus, a closed gap area 34 is formed between the internal electrode 32 and the portion 35 of the diaphragm 24, positioned opposite and covering the internal cavity 28.

More specific, the gap area 34 is limited on the one hand by the interface of the resonating substrate 18 and the diaphragm 24, i.e., the first surface 20 of the resonating substrate 18, and on the other hand by the internal electrode 32.

The resonating substrate 18 is configured by the choice of its thickness $t_1$ to obtain a resonance of the system of longitudinal mode acoustic waves generated between its first surface 20 and its second surface 22 when an electrostatic field with a sinusoidal component at the work frequency is generated in the gap area 34, as a result of the application of the differential voltage between the external electrode 26 and the internal electrode 32.

As shown in FIG. 1, the mounting 12 includes a through via 36 connecting the internal cavity 28 to an extra opening 38 pierced on the side of the first surface 14 of the mounting 12.

The external opening 38 has a depth $c_1$ and a diameter $d_2$, the internal cavity 28 has a depth $c_2$ and a diameter $d_3$.

The through via 36 here is in the form of a cylinder with diameter $d_1$ and length $t_2$.

A metal track 40 is deposited on an inner surface of the through via 36 and also covers a bottom of the external opening 38 so as to allow the internal electrode 32 to be connected to an electrical excitation/detection device.

Preferably, the external opening 38 has a square-shaped transverse section.

The thickness $e_1$ of the external electrode 26 is between 100 and 500 nm, preferably equal to 200 nm.

The thickness $t_1$ of the resonating substrate 18 is comprised between 200 and 500 μm, preferably between 300 and 400 μm, in particular equal to 380 μm.

The thickness $m_1$ of the diaphragm 24 is smaller than 600 nm, preferably equal to 300 nm.

The thickness $s_1$ of the mounting 12 is also equal to approximately 1 mm.

The internal cavity 28 has a depth $c_2$ between 500 and 1500 nm, preferably equal to 1000 nm, and a diameter $d_3$ of 10 mm.

The external opening 38 has a depth $c_1$ of 100 μm and a with $d_2$ of approximately 5 mm, and the through via 36 has a diameter $d_1$ of 1 mm and a length $t_2$ of approximately 900 μm.

The thickness $e_2$ of the internal electrode 32 is approximately 250 nm, such that the gap 34 has a height preferably equal to 1000 nm.

It should be noted that in FIG. 1, the gap area 34 is filled with air, but alternatively it may be filled with a vacuum or another gas forming a dielectric. In the case where the gap 34 is filled with a pressurized gas, it is necessary for the via 36 also to serve as an exhaust conduit for the gas.

Advantageously, the material of the resonating substrate 18 is a monocrystalline material capable of obtaining an optimized quality factor due to the viscoelastic friction coefficients, which are better than those of amorphous materials.

It should be noted that arranging the external electrode 26 on the second surface 22 of the resonating substrate 18 is optional. It serves as a ground electrode and trap for vibrations. To that end, it is advantageously open-worked, the different openings having a shape and surface area similar to those of the electrode 32.

The electrode 26 also makes it possible to weld an external electrical connecting wire to the resonator 10, since a direct electrical connection to the material of the substrate 18, such as silicon, is difficult to achieve.

Alternatively, a supply track positioned on at least one side end of the diaphragm 24, on the left or right in FIG. 1, is possible to connect the diaphragm 24 to an external excitation device.

Here, the arrangement of the external electrode 26 on the second free surface 22 of the resonating substrate 18, i.e., here doped silicon, facilitates the electrical connection of the surface 20, delimiting the gap area, to an external excitation device of the resonator (not shown in FIG. 1).

In the event the material of the resonating substrate 18 is an electrical insulator, the diaphragm 24 will be made up of a conducting material, for example metal, and it will be necessary to provide an electrical connecting element between that diaphragm 24 and the external electrode 26, for example such as an electrical connection well, i.e., a via passing through the resonating substrate in the direction of its thickness. Alternatively, a metallization return or machining freeing access to the diaphragm 24 may be done.

The operation of the volume wave resonator illustrated in FIG. 1 will now be described.

A high-level direct differential electrical voltage, i.e., greater than 20 V and potentially up to 300 V, is applied between the diaphragm 24 forming the electrode and the internal electrode 32.

The direct differential electrical voltage, also called polarization voltage of the gap area 34, is necessary to allow the direct excitation of oscillating mechanical fields within the resonating substrate 18.

In fact, the electrostatic force generated in the gap area 34 always attracts the surface 20 of the resonating substrate 18 toward the internal electrode 32, causing stretching of the resonating substrate 18 in the direction of its thickness. Consequently, a pre-voltage of the resonating substrate 18 is required and is created by applying the high-level direct differential voltage.

Simultaneously with the application of the high-level direct differential voltage signal, a sinusoidal voltage signal, with a low level relative to the level of the direct voltage signal in a ratio close to 20, is applied between the external electrode 26 and the internal electrode 32. Because the diaphragm 24 must be conductive in the case of an insulating resonating substrate, it may optionally be used directly for that purpose in place of the external electrode 26 if it is not electrically connected to the latter.

The alternating voltage thus increases or releases the electrostatic attraction force undergone by the resonating substrate 18 in the gap area 34 covered by the portion 35 of the diaphragm 24.

The generated electrostatic force is normal at the surface of the resonating substrate 18, such that, at the work frequency, for example 10.3 MHz, only purely longitudinal mode volume acoustic waves are excited.

This electrostatic force then generates volume waves within the resonating substrate 18 by electrostatic excitation, which corresponds to vibrations of the resonating substrate 18.

Because the thickness $t_1$ of the resonating substrate 18 is determined so as to produce, by resonance, longitudinal mode acoustic volume waves within the resonating substrate 18 at the work frequency of the resonator, a high coupling is created between the electrostatic mode in the gap 34 and the mechanical mode in the resonating substrate 18 consisting of an extension-compression of the thickness of the substrate.

The coupling coefficient of the resonator 10 depends on the elasticity of the material of the resonating substrate 18, the considered geometry, and the differential polarization voltage applied.

More specifically, the thickness $t_1$ is calculated such that the acoustic wave is reflected in the phase by the surfaces of the resonating substrate 18 so as to interfere constructively.

Furthermore, the thickness $t_1$ of the resonating substrate 18 is larger than a critical structural thickness to avoid any structural vibrations such as flexion of the resonating substrate 18 in the region of the inner cavity 28.

Due to the presence of the internal cavity 28 with a limited diameter $d_3$ and large thickness $t_1$ of the resonating substrate, a higher ratio $t_1/d_3$ between the thickness $t_1$ of the substrate 18 and the diameter $d_3$ of the internal cavity 28 is obtained compared to a thin resonating film.

Thus, the threshold for the electrostatic force beyond which the structure risks being destroyed is higher. The allowable deformation level that may be undergone by the resonating substrate 18 before it is destroyed is then higher. The level of the polarization voltage as well as the height $c_2$ of the gap that are allowed are also higher.

Furthermore, the breakdown threshold of the capacitor, constituted by the gap 34 and the conductive surfaces that delimit it, is also improved by at least a factor of two owing to the layer of insulating silicon of the diaphragm 24, which reduces the risk of priming an electric arc destroying the capacitor, thereby making it possible to apply higher polarization voltage levels.

Thus, the coupling between the electrostatic mode existing in the gap and the excited mechanical mode in the diaphragm 24 is increased. More specifically, the passivation pushes back the breakdown threshold and makes it possible to have a higher polarization voltage, which is favorable to good coupling. However, the presence of this layer of passivation silica decreases the field in the gap and, consequently, the coupling. A compromise must therefore be found.

In the embodiment shown in FIG. 1, a single internal electrode 32 is used for excitation of the volume waves, which corresponds to a one-port excitation mode.

As an alternative of the resonator 10 of FIG. 1, as illustrated in FIG. 2, a resonator 50 includes an electrical excitation/detection device 52 with a two-port excitation mode. In this example embodiment, the resonator 50 comprises a resonating substrate 54 with two surfaces on which two diaphragms 56, 58 are glued. Two mountings 60, 62, each comprising an internal electrode 64, 66, are respectively glued on each diaphragm 56, 58.

Each internal electrode 64, 66, similarly to the internal electrode 32 of the resonator 10 of FIG. 1, is deposited in a different internal cavity associated with the resonating substrate 54. Two gap areas 68, 70 are respectively delimited between the internal electrode 64 and the diaphragm 56 for the first area, and the internal electrode 66 and the diaphragm 58 for the second area.

The electrical excitation/detection device 52 includes a voltage generator 72 connected to the resonating substrate 54 on the one hand, and to each internal electrode 64, 66 on the other hand, so as to exert asymmetrical electrostatic excitation on the two surfaces of the resonating substrate 54. In that case, the increase in the electrostatic excitation forces allows an improvement in the electromechanical coupling.

It should be noted that the resonator 50 may be seen as two identical resonators 10 of FIG. 1 from which the external electrodes 26 have been removed and whereof the free surfaces of the two resonating substrates 18 have been brought together so as to provide a shared resonating substrate 54 in a single piece excited according to an electrostatic mode symmetrically.

FIG. 3 shows an example of a third embodiment 80 of a resonator according to the invention with one-port excitation whereof the elements shared with the resonator 10 of FIG. 1 are designated using identical references.

The resonator 80 comprises an electrical excitation/detection device 82 with a one-port excitation mode.

The electrical excitation/detection device 82 comprises a voltage generator 84 connected on the one hand to an internal electrode 86, and on the other hand to an external electrode 88, thereby making it possible to electrostatically excite the acoustic volume waves in the resonating substrate 18.

Like the resonators 10, 50 of FIGS. 1 and 2, the resonating substrate 18 here is made up of a doped silicon layer known to be a conducting material.

The gap area, here filled with air and designated by reference 90, comprised in an internal cavity covered by the diaphragm 24 and the resonating substrate 18, makes it possible to produce an acoustic impedance with a low value, capable of confining the acoustic volume waves within a vibrating area 92, shown in FIG. 3, of the resonating substrate 18.

Furthermore, here the external electrode 88 is made acoustically inert by making it rest in an inert area of the surface of the resonator.

Thus, the energy stored in the wave propagation area is not radiated outward, irrespective of whether the excitation is symmetrical.

The external electrode 88 is structured based on the nature of the resonating substrate 18 to allow trapping of the acoustic volume waves by local modification of the conditions at the mechanical limits. In the embodiment of FIG. 3, the external electrode 88 includes a hole 94 so as to favor acoustic trapping within the silicon used as resonating substrate 18.

Furthermore, in this embodiment, the through via 36 is off-centered relative to the vibrating area 92 and the width of the internal cavity is enlarged asymmetrically such that the vibrating area 92 is not across from the through via 36, the latter thus being arranged under a non-vibrating area so as to avoid any contact with the vibrating area 92.

Advantageously, the resonator 80 according to the invention includes an element for trapping volume waves in the resonating substrate 18, so as to improve the quality coefficient of the resonator 80.

More specifically, the shape of the resonating substrate 18 is modified so as to optimize the trapping of the acoustic volume waves within the substrate 18. Preferably, the layer of the resonating substrate 18 is made locally thinner on one or two surfaces so as to obtain a concave surface with an optimized curve radius. Alternatively, a mass overload is done of the edges of the external electrode 88.

Using the excitation/detection device 82 makes it possible to apply a significant direct voltage, serving to polarize the gap area 90, and at the same time the low-voltage sinusoidal signal, serving to keep the vibrations around an equilibrium state.

The excitation device 82 is also capable of detecting variations of the electrical field generated by the vibration of the resonating substrate 18.

The resonance frequency of the resonator 80 is primarily determined by the thickness $t_1$ of the resonating substrate 18 and by the elastic characteristics of the material of the resonating substrate 18. More specifically, since each material has a given acoustic volume wave propagation speed that is directly related to the resonance frequency, the choice of the material determines the resonance frequency of the desired resonator.

Preferably, the resonator 80 has a resonance frequency comprised between 10 and 100 MHz.

FIG. 4 shows a flowchart of a method 100 for manufacturing a resonator 10 according to the invention.

In a first step 102, a mounting 12 is provided with two surfaces made up of a layer with a first thickness of a first material. Preparation of the mounting 12 comprises dust removal, acid etching in order to limit the absorbed organic elements, and rinsing. The material of the mounting 12 is comprised in the set of materials made up of glass, ceramic, molten silica, or another insulating material.

Preferably, the material used is glass due to its electrical insulating capacity, its stability over time, and its ability to receive a deposition of metal electrodes and to be assembled with other materials, for example by anode welding.

In a second step 104, etching of the provided substrate 12 is done so as to obtain a predetermined shape of the internal cavity 28, the through via 36, and the external opening 38, for example such as the shape shown in FIG. 1. More specifically, three sub-steps are carried out in order to obtain a first blind orifice, or external opening 38, on the first lower surface 14, a second blind orifice, or internal cavity 28, on the second upper surface 16, and a third through orifice, or through via 36.

During the first sub-step, a whole-wafer Cr/Cu (Chrome/Copper) deposition is done by cathode sputtering on the first lower surface 14 of the mounting 12. Next, resin induction by centrifugation is carried out, then the use of a mask with a single-surface aligner makes it possible, after exposure and developing, to keep only a portion of the deposited resin with a given diameter and thickness.

Next, a deposition of nickel is done by electroforming, then the resin portion is removed. Deep reactive ion etching (DRIE) is then used to obtain an external opening 38 on the first lower surface 14 of the mounting 12 with a given depth and diameter.

Preferably, the transverse section of the obtained external opening 38 has a square shape.

Then, during the second sub-step, after removal of the nickel, copper and chrome, a resin deposition is done on the second upper surface 16 of the mounting 12. Next, a mask is used with a single-surface aligner so as to remove, after exposure and developing, a portion of the deposited resin with a given diameter and thickness. Reactive ion etching (RIE) makes it possible next to obtain an internal cavity 28, on the second upper surface 16 of the mounting 12 with a given depth and diameter.

A resin deposition is then applied so as to obtain protection for the two surfaces 14, 16 of the mounting 12.

During the third sub-step, a through via 36 is made by ultrasound machining so as to connect the two cavities 28, 38 through the respective bottoms.

Next, after removal of the protective resin and baking, a step 106 for metallizing the mounting 12 is carried out so as to obtain a thin electrode, or internal electrode 32, by metallization of the bottom of the internal cavity 28. Furthermore, the external openings 38 and the side wall of the through via 36 are metallized to facilitate the connection of the internal electrode 32 to an external excitation device.

More specifically, a whole-wafer Au/Cr (Gold/Chrome) double-surface metallization is first done by sputtering on all of the upper and lower surfaces of the mounting 12, and the side wall of the through via 36. Then, after coating with a double-surface positive resin by nebulization, the use of masks with a double-surface aligner associated with developing and rinsing operations makes it possible to obtain, after wet Au/Cr etching, the internal electrode 32 and the track 40 as illustrated, for example, in FIG. 1.

Next, the remaining resin is removed, then rapid thermal annealing (RTA) is done, so as to obtain the final state of the assembly formed by the mounting 12 and the internal electrode 32.

In a step 108, a resonating substrate 18 with two surfaces is provided made up of a layer with a second thickness of a second material. The material of the resonating substrate 18 is comprised in the set of materials made up of silicon, lithium niobate, quartz, corindon, for example sapphire, and aluminum-yttrium garnets.

Preferably, the material used is silicon due to its conductive or insulating nature based on the doping and its compatibility with the production of electronic circuits.

The thickness of the substrate 18 has been determined beforehand to allow the creation and maintenance of longitudinal mode acoustic waves in the direction of the thickness vibrating at the work frequency of the resonator 10.

In a step 110, a diaphragm is formed made up of a layer with a third thickness of a third material, for example silica, on a first surface of the resonating substrate 18.

More specifically, one starts by producing a layer of silica by thermal oxidation on the two surfaces of the resonating substrate 18. Then, after deposition of a resin to protect a first surface, or lower surface, of the assembly formed by the resonating substrate 18 and the silica layers, wet etching is done of the "resonating substrate/silica layers" assembly so as to remove the resin on the upper surface. Thus, a diaphragm 24 is obtained on the lower surface of the resonating substrate 18.

In a step 112, after a bath with a sulfochromic mixture for the mounting 12 and the resonating substrate 18, gluing of the "resonating substrate 18/diaphragm 24" assembly is done with the mounting 12. More specifically, the lower surface of the "resonating substrate 18/diaphragm 24" assembly is welded to the second upper surface 16 of the mounting 12 using Pyrex/silicon anode welding. A gap 34 is thus obtained filled with air within the internal cavity 28.

During this anode welding done using a welding machine, a high voltage of approximately 900 V is applied between the electrode 26 deposited on the upper surface of the resonating substrate 18 and the first lower surface 14 of the mounting 12. The internal electrode 32, positioned at the bottom of the internal cavity 28, is electrically connected to the metal layer 40 deposited in the via 36, and in particular the bottom of the cavity 38. Any risk of electrical breakdown in the gap due to the application of the voltage during the anode welding process is limited due to the fact that the cavity 38 is withdrawn relative to the free surface 14.

In a subsequent step 114, an external electrode 26 is metallized on the second surface 22, or upper surface, of the resonating substrate 14 using an Al/Cr (Aluminum/Chrome) deposition.

Advantageously, in an additional step that is not shown, the external opening 38 is plugged by a wafer with dimensions close to those of the cavity 38, so as to preserve the vacuum or prevent any introduction of impurities within the internal cavity 28.

The ohmic contact between the electrode 26 and the resonating substrate 18 is improved by a first rapid thermal annealing (RTA). This is followed by a second annealing followed by slow cooling, improving the characteristics of the resonator 10. Lastly, cutting is done using a micro-saw to make it possible to obtain a resonator 10 with the desired external dimensions.

Preferably, the resonator 10 further comprises a device 200 for compensating the static capacity of the resonator 10. FIGS. 5 and 6 show two example embodiments of such a device 200, in which a direct voltage generator 202 and an alternating current generator 204 can respectively apply a polarization voltage $V_{BIAS}$ and a sinusoidal voltage $V_{AC}$ at the resonator 10 between the internal electrode 32 and the external electrode 26.

The resonator 10 is shown by a Butterworth-Van Dyke (BVD) model, known by those skilled in the art.

The BVD model defines a static capacity $C_0$ that represents the static capacity intrinsic to the configuration of the resonator 10. In the example embodiment according to the invention, the static capacity $C_0$ essentially represents the gap in the internal cavity 28 of the resonator 10, associated with the silica layer of the diaphragm 24 and intended to reduce the breakdown voltage.

The BVD model also defines a serial branch including three motional components Rm, Lm, Cm, positioned in parallel with the static capacity $C_0$. The three motional components Rm, Lm, Cm respectively represent the mechanical strength of the material against the acoustic vibration, the inductance representative of the mass of acoustically resonating materials, and a capacity corresponding to the elasticity of the material.

As an example, the component Cm has a value of several fentofarads and the value of $C_0$ is approximately 150 to 400 picofarads.

In the example embodiment illustrated in FIG. 5, the device 200 further includes a bias tee 206 connected at the input on the one hand to the direct fault generator 202, and on the other hand to the alternating current generator 204. At the output, the bias tee 206 is connected to a first electrode of the resonator 10 so as to apply, according to a one-port-type system, both a direct electrical voltage and an alternating electrical voltage. In this embodiment, the direct voltage generator 202, the alternating current generator 204, and the bias tee 206 thus form an electrical excitation device 52.

The resonator 10 is also connected, by its second electrode, to a ground 208. A serial branch, comprising an induction coil 210 and a capacitor 212, is positioned in parallel with the resonator 10. The induction coil 210 has an inductance L representing a compensating inductance producing the relationship $LC0\ \omega^2 = 1$, where $\omega$ designates the usage frequency of the device 200.

Since the value of the static capacity $C_0$ is much higher than the value of Cm, the induction coil 210 thus makes it possible to compensate, by antiresonant circuit $LC_0$, the static capacity $C_0$ of the resonator 10. The capacitor 212 with capacity C makes it possible to prevent the induction coil 210 from short-circuiting the direct voltage generator 202.

In the example embodiment illustrated in FIG. 6, based on a quadripole-type assembly, the device 200 further includes a serial branch, comprising a transformer 214 with four poles and a capacitor 216, positioned in parallel with the resonator 10. More precisely, the transformer 214 is connected by a first pole to a first node 218 connected to the first electrode of the resonator 10, by a second pole to the capacitor 216, by a third pole to the ground 208, and by a fourth pole to the alternating voltage generator 204.

The second electrode of the resonator 10 is connected to a second midpoint 220 connected on the one hand to the capacitor 216, and on the other hand to a first terminal of a resistance 222, the second terminal being connected to the ground 208.

Lastly, the node 218 is also connected on the one hand to the ground 208 and on the other hand to a serial branch made up of an induction coil 224 and the direct voltage generator 202.

In this example embodiment, the direct voltage generator 202, the alternating current generator 204, and the induction coil 224 thus form an electrical excitation device 30.

During operation, the resonator 10 is capable of generating an output current Is. The use of the transformer 214 makes it possible to inject, in the output current Is, a current Ic in phase opposition with the through current $C_0$, which makes it possible to compensate the effect of the static capacity $C_0$ of the resonator 10 at the resistance 222.

Thus, the device 200 for compensating the static capacity makes it possible to decrease the effect of the static capacity $C_0$ of the resonator 10, either by using an induction coil 210, or by using a transformer 214, so as to improve the electrochemical coupling of the resonator 10.

A network analyzer is used in order to obtain an electrical response of the resonator 10 and precisely determine the resonance frequency. For example, in the embodiment illustrated in FIG. 5, the alternating voltage generator 204 is replaced by the network analyzer to obtain the transmission electrical response of the resonator 10. In the case of FIG. 6, the two paths of the analyzer replace the alternating voltage generator 204 and the resistance 222 for a transmission mode measurement.

As an example, in the case of a resonating substrate 18 made from silicon, FIG. 7 illustrates different resonance curves each parameterized by an applied polarization voltage value comprised between 40 V and 200 V.

Each resonance curve represents an electrical response Re(Y) of the resonator 10, and more specifically the evolution of its input conductance, as a function of the frequency of the sinusoidal excitation signal. In this example, it is easy to see the influence of the polarization voltage on the quality of the resonance, the resonance frequency being close to 10.3 MHz, and the quality of the resonance being able to be estimated as the ratio of the height of the resonance lobe to its width at a predetermined roll-off.

Quality coefficient measurements on the resonator 10 according to the invention, using the network analyzer, make it possible to characterize the vibrations caused by electrostatic effect. Thus, the measured quality coefficient is approximately 8000, which makes it possible to obtain a product Qf close to $10^{11}$.

The resonator according to the invention is suitable for use to manufacture an electrical oscillator.

In a known manner, the oscillator assumes the form of a looped system comprising an active element, for example an amplifier circuit, and a passive element comprising the resonator. The looped system, operating at a given operating point, is intended to reinject a synchronous signal with the vibration of the resonator, which makes it possible to compensate the insertion losses inherent to any resonating structure.

The resonator according to the invention is also suitable for use as a filter, for example by combining impedance elements or as a monolithic structure.

Lastly, the resonator according to the invention is suitable for use as a sensor. In fact, the resonator being sensitive to parametric effects, i.e., variations in the environmental operating conditions, it is therefore suitable for use as a physical property sensor. Examples include the physical properties of temperature, pressure, acceleration, or the mass of a fine layer deposited on the external electrode 26.

Generally, the invention makes it possible to eliminate the piezoelectric effect for the excitation of volume waves and therefore makes it possible to excite those waves directly in all types of materials, and in particular in non-piezoelectric materials.

This characteristic makes it possible to have a field of materials not limited to piezoelectric materials. As a result, the invention has many advantages in terms of cost, size, and overall operating reductions of the concerned components, in particular owing to the improvement of the co-integration of the resonator 10 with the associated electronic devices, thereby making it possible to minimize hybridization of the components.

The invention claimed is:

1. An acoustic volume wave resonator configured to resonate at a predetermined work frequency comprising:
    a mounting, comprising a first surface and a second surface, formed by a layer, with a first thickness ($s_1$), of a first acoustically and electrically insulating material,
    a resonating substrate, comprising a first surface and a second surface, made up of at least one layer, with a second thickness ($t_1$), of a second acoustically resonating material, and
    a diaphragm, made up of a layer, with a third thickness ($m_1$), of a third material, the diaphragm rigidly connecting the second surface of the mounting on the one hand and the first surface of the resonating substrate on the other hand,
    characterized in that
    the mounting comprises an internal cavity emerging on the second surface of the mounting, having a floor surface situated withdrawn in the direction of the thickness of the mounting relative to the second surface of the mounting, and a planar metal internal electrode, deposited on the floor surface, so as to form a gap area between the internal electrode and a portion of the diaphragm positioned across from it, and in that
    the resonating substrate is configured by the choice of said second thickness ($t_1$) so as to create a coupling between an electrostatic mode in the gap area and an extension-compression mechanical mode of a thickness of the resonating substrate so as to generate, between its first surface and its second surface, longitudinal mode acoustic waves vibrating at the work frequency of the resonator, when an electrostatic field having a sinusoidal component at the work frequency is generated in the gap area by applying a differential voltage between either the first surface of the resonating substrate and the internal electrode when the resonating substrate is electrically conductive and the diaphragm is electrically insulating, or the diaphragm and the internal electrode when the resonating substrate is electrically insulating and the diaphragm is electrically conducting.

2. The acoustic volume wave resonator according to claim 1, wherein a metallic external electrode is deposited on the second surface of the resonating substrate to facilitate the electrical access of an excitation device to the membrane.

3. The acoustic volume wave resonator according to claim 2, characterized in that the external electrode has a shape configured to trap the acoustic volume waves in a vibrating area.

4. The acoustic volume wave resonator according to claim 3, characterized in that the internal cavity has a shape configured so that the through via is across from a non-vibrating area and all contact between the through via and the vibrating area is avoided.

5. The acoustic volume wave resonator according to claim 2, characterized in that the resonating substrate is an electrical insulator, and in that it comprises an electrical connection well connecting the external electrode and the diaphragm, which is conductive in this case.

6. The acoustic volume wave resonator according to claim 1, characterized in that the internal cavity includes an edge with the second surface of the mounting having a contour that delimits a surface area of the diaphragm portion that can be deformed in the direction of the thickness of the diaphragm when an electrical field is applied in the gap area.

7. The acoustic volume wave resonator according to claim 1, characterized in that the mounting comprises a through via connecting the internal cavity to an external opening, pierced on the first surface of the mounting, and a metal access track, deposited in an internal surface of the through via and connected to the internal electrode to facilitate the connection of the internal electrode to an external excitation device.

8. The acoustic volume wave resonator according to claim 1, characterized in that the second material of the resonating substrate is an element from the set of materials made up of silicon, sapphire, aluminum-yttrium garnet, lithium niobate, and quartz.

9. The acoustic volume wave resonator according to claim 1, characterized in that the third material of the diaphragm is an element from the group consisting of silica, silicon nitride, aluminum, gold, platinum, and tungsten.

10. The acoustic volume wave resonator according to claim 1, characterized in that the first material of the mounting is a material comprised in the group of materials consisting of glass, molten silica, and ceramic.

11. The acoustic volume wave resonator according to claim 1, characterized in that the second material of the resonating substrate is a non-piezoelectric material.

12. The acoustic volume wave resonator according to claim 1, characterized in that the second material of the resonating substrate is a monocrystalline material.

13. The acoustic volume wave resonator according to claim 1, characterized in that it comprises
    an electrical excitation/detection device configured to create, in the gap area and the insulating diaphragm, an electrical electrostatic excitation field of the resonating substrate at the work frequency, and to detect the electrical field variations at the work frequency caused by the acoustic vibrations of the resonating substrate, and a device for compensating a static capacity of the gap comprising at least one element from the group consisting of: an induction coil and a transformer.

14. An electronic component comprising a resonator, said resonator being defined according to claim 1, characterized in that the electronic component is an element from the group consisting of an oscillator, a filter and a sensor.

\* \* \* \* \*